United States Patent
Park

(10) Patent No.: US 9,299,805 B2
(45) Date of Patent: Mar. 29, 2016

(54) VARIABLE RESISTIVE MEMORY DEVICE INCLUDING VERTICAL CHANNEL PMOS TRANSISTOR

(71) Applicant: SK hynix Inc., Gyeonggi-do (KR)

(72) Inventor: Nam Kyun Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/792,260

(22) Filed: Jul. 6, 2015

(65) Prior Publication Data

US 2015/0311255 A1 Oct. 29, 2015

Related U.S. Application Data

(63) Continuation of application No. 14/076,921, filed on Nov. 11, 2013, now Pat. No. 9,082,697.

(30) Foreign Application Priority Data

Aug. 19, 2013 (KR) .................. 10-2013-0097818

(51) Int. Cl.
| | |
|---|---|
| *H01L 29/66* | (2006.01) |
| *H01L 27/24* | (2006.01) |
| *H01L 29/78* | (2006.01) |
| *H01L 27/22* | (2006.01) |
| *H01L 29/16* | (2006.01) |

(52) U.S. Cl.
CPC ........ *H01L 29/66666* (2013.01); *H01L 27/228* (2013.01); *H01L 27/2454* (2013.01); *H01L 29/1608* (2013.01); *H01L 29/7827* (2013.01)

(58) Field of Classification Search
USPC ....................................................... 257/365
See application file for complete search history.

(56) References Cited

U.S. PATENT DOCUMENTS

| | | | | |
|---|---|---|---|---|
| 8,237,226 | B2* | 8/2012 | Okano | H01L 21/324 257/368 |
| 2007/0295995 | A1* | 12/2007 | Yun | H01L 27/10885 257/202 |
| 2008/0296632 | A1* | 12/2008 | Moroz | H01L 21/823807 257/255 |
| 2009/0085062 | A1* | 4/2009 | Jin | H01L 29/66795 257/190 |
| 2009/0256208 | A1* | 10/2009 | Okano | H01L 21/324 257/365 |
| 2010/0127327 | A1* | 5/2010 | Chidambarrao | H01L 29/66795 257/347 |
| 2010/0207172 | A1* | 8/2010 | Masuoka | H01L 21/823807 257/255 |
| 2010/0219482 | A1* | 9/2010 | Masuoka | H01L 21/845 257/369 |
| 2011/0186797 | A1* | 8/2011 | Herner | G11C 17/16 257/2 |
| 2014/0061815 | A1* | 3/2014 | Jagannathan | H01L 27/0924 257/369 |

* cited by examiner

*Primary Examiner* — Caleb Henry
(74) *Attorney, Agent, or Firm* — IP & T Group LLP

(57) ABSTRACT

A semiconductor device having a vertical channel, a variable resistive memory device including the same, and a method of manufacturing the same are provided. The semiconductor device having a vertical channel includes a vertical pillar formed on a semiconductor substrate and including an inner portion and an outer portion surrounding the inner portion, junction regions formed in the outer portion of the vertical pillar, and a gate formed to surround the vertical pillar. The inner portion of the vertical pillar has a lattice constant smaller than that of the outer portion of the vertical pillar.

8 Claims, 5 Drawing Sheets

VARIABLE RESISTIVE MEMORY DEVICE INCLUDING VERTICAL CHANNEL PMOS TRANSISTOR

CROSS-REFERENCES TO RELATED APPLICATION

This application is a continuation of U.S. patent application Ser. No. 14/076,921 filed on Nov. 11, 2013, which claims priority under 35 U.S.C. 119(a) to Korean application No. 10-2013-0097818, filed on Aug. 19, 2013, in the Korean Intellectual Property Office. The disclosure of each of the foregoing application is incorporated by reference in its entirety as set forth in full.

BACKGROUND

1. Technical Field

The inventive concept relates to a semiconductor integration circuit device and a method of manufacturing the same, and, more particularly, to a variable resistive memory device including a PMOS transistor having a vertical channel and a method of manufacturing the same.

2. Related Art

With the rapid development of mobile and digital information communication and consumer-electronic industries, studies on existing electronic charge-controlled devices may encounter limitations. Thus, new functional memory devices other than the existing electronic charge-controlled devices need to be developed. In particular, next-generation memory devices with large capacity, ultra-high speed, and ultra-low power need to be developed to satisfy demands on large capacity of memories in main information apparatuses.

Currently, variable resistive memory devices using a resistive device as a memory medium have been suggested as the next-generation memory devices. Typically examples of the resistance variable memory device are phase-change random access memories (PCRAMs), resistive RAMs (ReRAMs), and magneto-resistive RAMs (MRAMs).

Each of the variable resistive memory devices may include a switching device and a resistive device, and store data "0" or "1" according to a state of the resistive device.

Even in the variable resistive memory devices, the first priority is to improve integration density and to integrate memory cells in a limited and small area, integrating as many as possible.

To satisfy the demands, the variable resistive memory devices also employ a three-dimensional (3D) transistor structure. The 3D transistors may include a channel extending to a direction perpendicular to a surface of a semiconductor substrate and a surrounding gate formed to surround the channel.

The 3D transistors require a high operation current to maintain high resistance variable characteristics.

SUMMARY

According to an exemplary embodiment of the invention concept, there is provided a semiconductor device. The semiconductor device may include a vertical pillar formed on a semiconductor substrate and including an inner portion and an outer portion surrounding the inner portion, junction regions formed in the outer portion of the vertical pillar, and a gate formed to surround the vertical pillar, Wherein the inner portion of the vertical pillar has a lattice constant smaller than that of the outer portion of the vertical pillar.

According to another exemplary embodiment of the inventive concept, there is provided a variable resistive memory device. The variable resistive memory device may include a pillar including a channel region, a source located below the channel region, and a drain located on the channel region; a gate formed to surround an outer circumference of the pillar, a heating electrode formed over the drain, and a variable resistance layer formed on the heating electrode, wherein the channel region of the pillar is formed in such a manner that compressive stress is provided to the channel region by a junction of the channel region with at least one of regions in which the source and the drain are formed.

According to still another exemplary embodiment of the inventive concept, there is provided a method of manufacturing a semiconductor device. The method may include forming a first semiconductor layer on the semiconductor substrate, wherein the first semiconductor layer has a lattice constant smaller than that of a semiconductor substrate; patterning the first semiconductor layer and a portion of the semiconductor substrate to form a preliminary pillar; forming a second semiconductor layer having the same material as the semiconductor substrate on an outer circumference of the preliminary pillar to form a pillar; forming a drain in an upper portion of the pillar and a source in a lower portion of the pillar; and forming a gate to surround an outer circumference of the pillar.

These and other features, aspects, and embodiments are described below.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
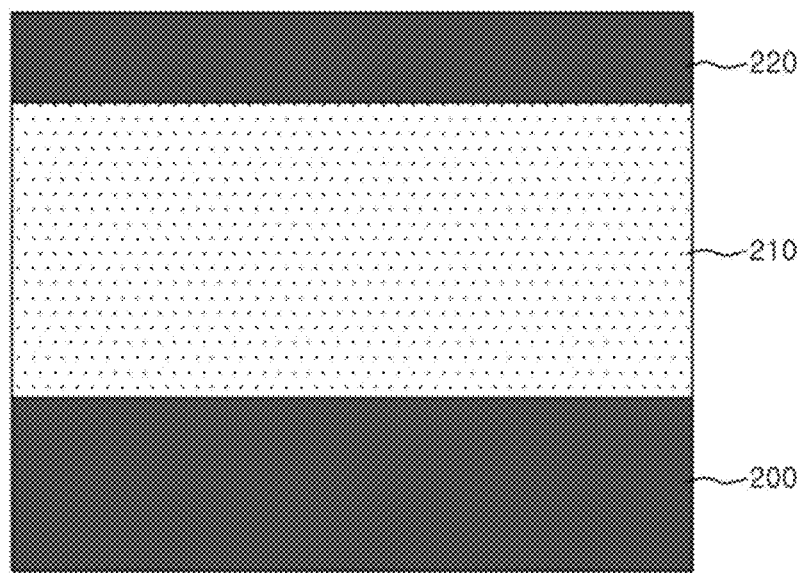
FIGS. 1 to 5 are cross-sectional views illustrating a method of manufacturing a semiconductor device having a vertical channel according to an embodiment of the inventive concept.

Hereinafter, exemplary embodiments will be described in greater detail with reference to the accompanying drawings. Exemplary embodiments are described herein with reference to cross-sectional illustrations that are schematic illustrations of exemplary embodiments and intermediate structures. As such, variations from the shapes of the illustrations as a result, for example, of manufacturing techniques and/or tolerances, are to be expected. Thus, exemplary embodiments should not be construed as limited to the particular shapes of regions illustrated herein but may include, deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present. It is also noted that in this specification, "connected/coupled" refers to one component not only directly coupling another component but also indirectly coupling another component through an intermediate component. In addition, a singular form may include a plural form as long as it is not specifically mentioned in a sentence.

The inventive concept is described herein with reference to cross-section and/or plan illustrations that are schematic illustrations of exemplary embodiments of the inventive concept. However, embodiments of the inventive concept should not be construed as limited to the inventive concept. Although a few embodiments of the inventive concept will be shown and described, it will be appreciated by those of ordinary skill in the art that changes may be made in these exemplary embodiments without departing from the principles and spirit of the inventive concept.

Referring to FIG. 1, a semiconductor substrate 200 is prepared. The semiconductor substrate 200 may be, for example, a silicon (Si) substrate containing first conductivity impurities such as N type impurities. The N type impurities may include phosphor (P) or arsenic (As). A first semiconductor layer 210 and a second semiconductor layer 220 are sequentially deposited on the semiconductor substrate 200. The first semiconductor layer 210 may be formed of a material having a lattice constant smaller than that of the semiconductor substrate 200 formed of silicon (Si). The first semiconductor layer 210 may include one selected from the group consisting of silicon carbide (SiC), aluminum nitride (AlN), gallium nitride (GaN), zinc sulfide (ZnS), zinc oxide (ZnO), zinc selenide (ZnSe), cadmium sulfide (CdS), boron phosphide (BP), indium nitride (InN), and cadmium selenide (CdSe). The first semiconductor layer 210 may be a region in which a channel is to be substantially formed in a subsequent process. A thickness of the first semiconductor layer 210 may be determined by considering a length of the channel. For example, the first semiconductor layer 210 may be grown in a single crystalline structure through an epitaxial growth method by considering carrier mobility characteristics. The second semiconductor layer 220 may be formed on the first semiconductor layer 210. The second semiconductor layer 220 may be formed of the same material as that of the semiconductor substrate 200, for example, silicon (Si). The second semiconductor layer 220 may be a region in which a drain region is to be formed in a subsequent process. A length of the second semiconductor layer 220 may be determined by considering a width of the drain region.

Figure 2:
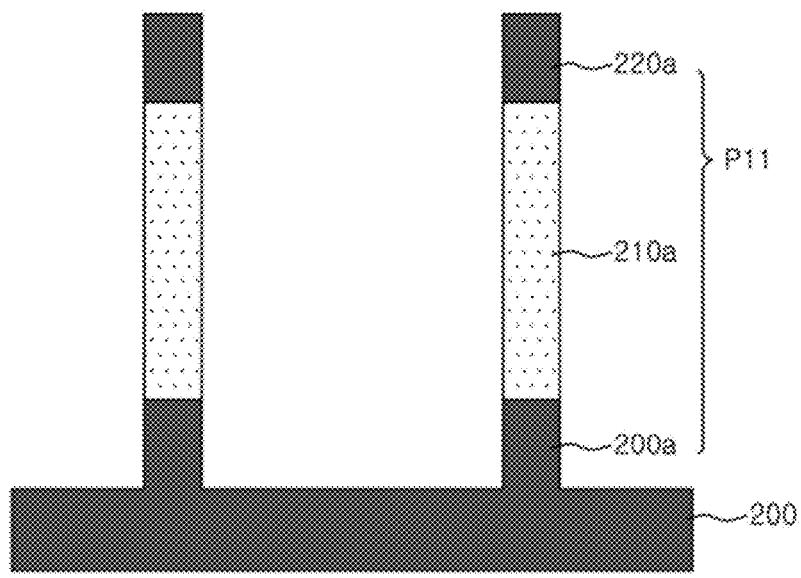

Referring to FIG. 2, the second semiconductor layer 220, the first semiconductor layer 210, and a portion of the semiconductor substrate 200 are patterned to form a preliminary pillar P11. The preliminary pillar P11 may have a line width smaller than that of a vertical channel to be formed. The reference numerals 220a, 210a, and 200a denote a patterned second semiconductor layer a patterned first semiconductor layer, and a patterned portion of the semiconductor substrate, respectively.

Figure 3:
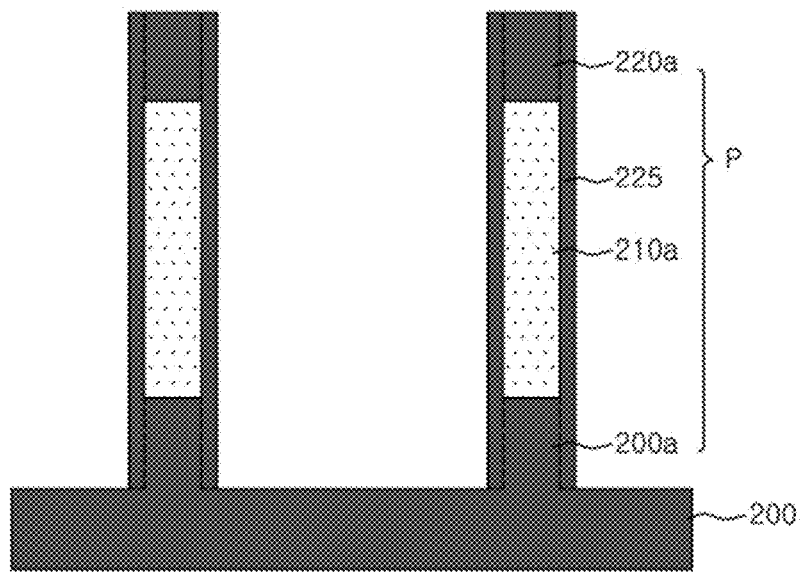

Referring to FIG. 3, a third semiconductor layer 225 may be formed on an outer wall of the preliminary pillar P11 referenced in FIG. 2. For example, the third semiconductor layer 225 may be formed of the same material as those of the patterned portion of the semiconductor substrate 200a and the patterned second semiconductor layer 220a, such as, a silicon (Si) material. The third semiconductor layer 225 may be formed on the resulting structure on the semiconductor substrate, in which the preliminary pillar P11 referenced in FIG. 2 is formed, using an epitaxial growth method. The third semiconductor layer 225 may be formed on the outer wall of the preliminary pillar P11 referenced in FIG. 2 using a spacer etching method such as an anisotropic etching method. Therefore, a pillar P for forming a vertical channel is completed. An inner portion of the pillar P is formed of a material having a lattice constant smaller than that of an outer portion of the pillar P. That is, a channel region in which a channel is to be substantially formed and a region other than the channel region may be formed of different semiconductor materials from each other, and the channel region may be formed to be surrounded with the region other than the channel region. The channel region may be formed of a material having a lattice constant smaller than that of the region other than the channel region.

Figure 4:
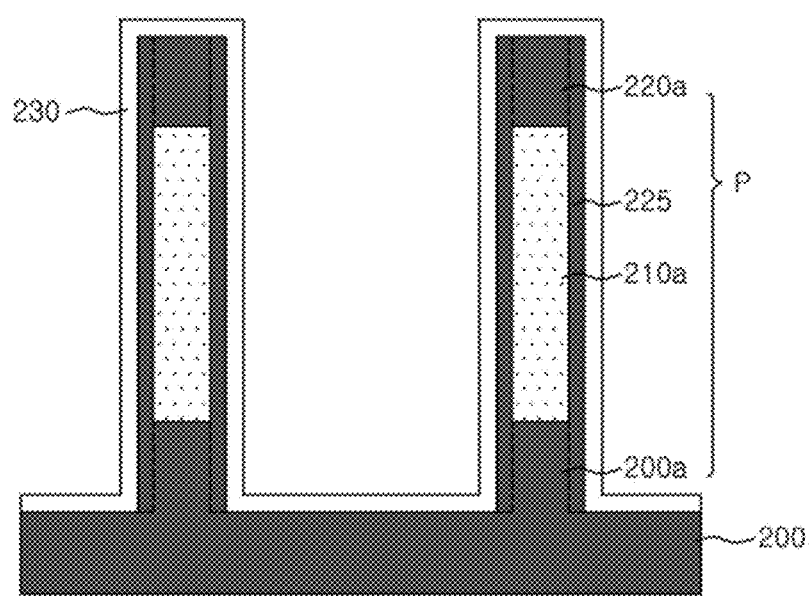

Referring to FIG. 4, a gate insulating layer 230 may be formed on the pillar P and an exposed surface of the semiconductor substrate 200. The gate insulating layer 230 may include a silicon oxide (SiO$_2$) layer formed through an oxidation method. The gate insulating layer 230 may include a metal oxide layer such as a tantalum oxide (TaO) layer, a titanium oxide (TiO) ayer, a barium titanate (BaTiO) layer, a barium zirconate (BaZrO) layer, a zirconium oxide (ZrO) layer, a hafnium oxide (HfO) layer, a lanthanum oxide (LaO) layer, an aluminum oxide (AlO) layer an yttrium oxide (YO) layer, or a zirconium silicide oxide (ZrSiO) layer, or a metal nitride layer, or a combination thereof, which is deposited through a deposition method.

Figure 5:
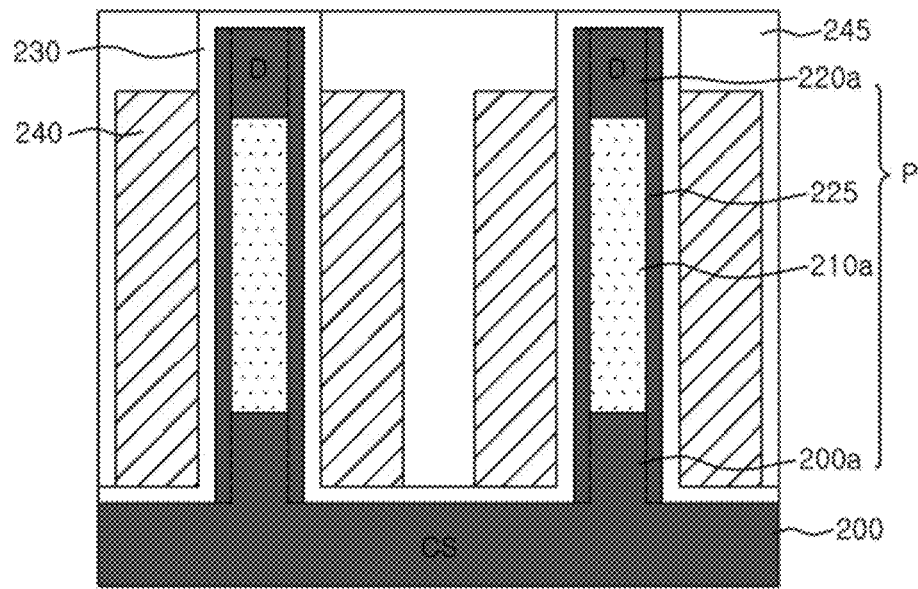

Referring to FIG. 5, second conductivity impurities, for example, P type impurities such as, ions containing boron (B), are implanted into an upper region (a region corresponding to the second semiconductor layer) and a lower region (a region corresponding to the semiconductor substrate) of the pillar P to form a drain D in the upper region of the pillar P and form a source in the lower region of the pillar P, thus, a PMOS transistor is defined. The source may be formed in the entire semiconductor substrate 200, that is, an entire active region defined in the semiconductor substrate 200 to operate as a common source CS. The drain D may be formed in a lightly doped drain (LDD) manner to reduce a short channel effect such as gate-induced drain leakage (GIDL). Next, a surrounding gate 240 may be formed on an outer circumference of the pillar P. The surrounding gate 240 may be formed, for example, by depositing a gate conductive layer on a surface of the resulting structure on the semiconductor substrate, in which the gate insulating layer 230 is formed, and etching the gate conductive layer using an anisotropic etching method. The surrounding gate 240 may be formed to have a height lower than that of the pillar P. The surrounding gate 240 may be formed to correspond to a substantial channel region, that is, a region of the patterned first semiconductor layer 210a. The surrounding gate 240 may include, for example, at least one selected from the group consisting of tungsten (W), copper (Cu) titanium nitride (TiN), tantalum nitride (TaN), tungsten nitride (WN), molybdenum nitride (MoN), niobium nitride (NbN), titanium silicon nitride (TiSiN), titanium aluminum nitride (TiAlN), titanium boron nitride (TiBN), zirconium silicon nitride (ZrSiN), tungsten silicon nitride (WSiN), tungsten boron nitride (WBN), zirconium aluminum nitride (ZrAlN), molybdenum silicon nitride (MoSiN), molybdenum aluminum nitride (MoAlN), tantalum silicon nitride (TaSiN), tantalum aluminum nitride (TaAlN), titanium (Ti), molybdenum (Mo), tantalum (Ta), titanium silicide (TiSi), tantalum silicide (TaSi), titanium tungsten (TiW), titanium oxynitride (TiON), titanium aluminum oxynitride (TiAlON), tungsten oxynitride (WON), tantalum oxynitride (TaON), and doped polysilicon. Next, an interlayer insulating layer 245 may be formed to be buried in the resulting structure on the semiconductor substrate, in which the surrounding gate 240 is formed.

Figure 6:
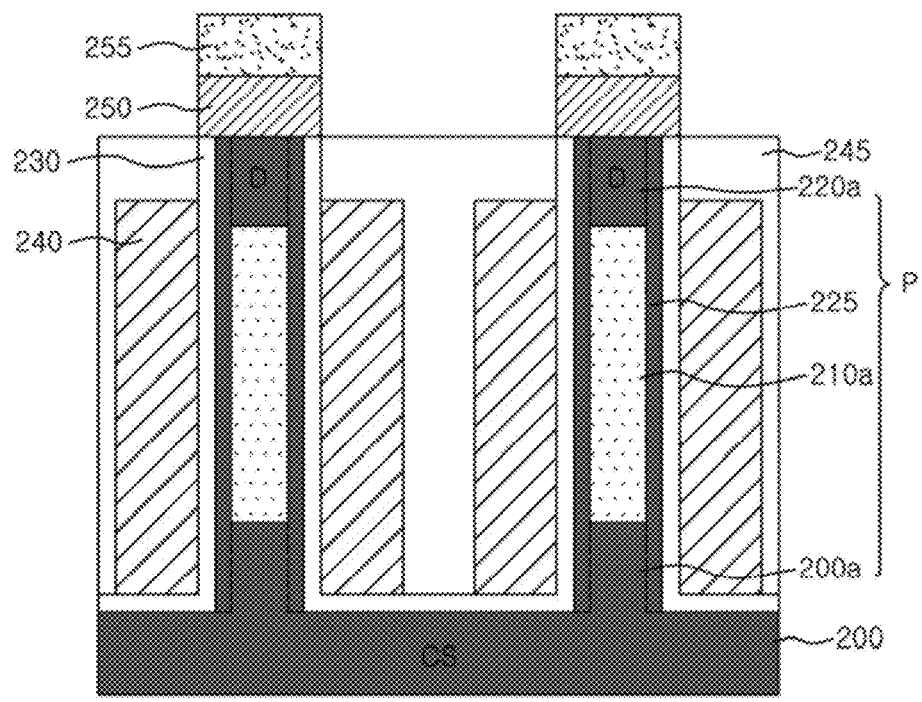
FIG. 6 is a cross-sectional view illustrating a variable resistive memory device including a semiconductor device having a channel according to an embodiment of the inventive concept.

As illustrated in FIG. 6, a heating electrode 250 and a patterned variable resistance layer 255 are sequentially formed on the drain D to form a variable resistive memory device. The heating electrode 250 and the patterned variable resistance layer 255 may be formed by sequentially forming a heating electrode layer and a variable resistance layer on the resulting structure on the semiconductor substrate, in which the interlayer insulating layer 245 is formed, and patterning the heating electrode layer and the variable resistance layer. The patterned variable resistance layer 255 may include a PCMO layer for a ReRAM, a chalcogenide layer for a PCRAM, a magnetic layer for a MRAM, a magnetization reversal device layer for a spin-transfer torque magnetoresistive RAM (STTMRAM) or a polymer layer for a polymer RAM (PoRAM).

Figure 7:
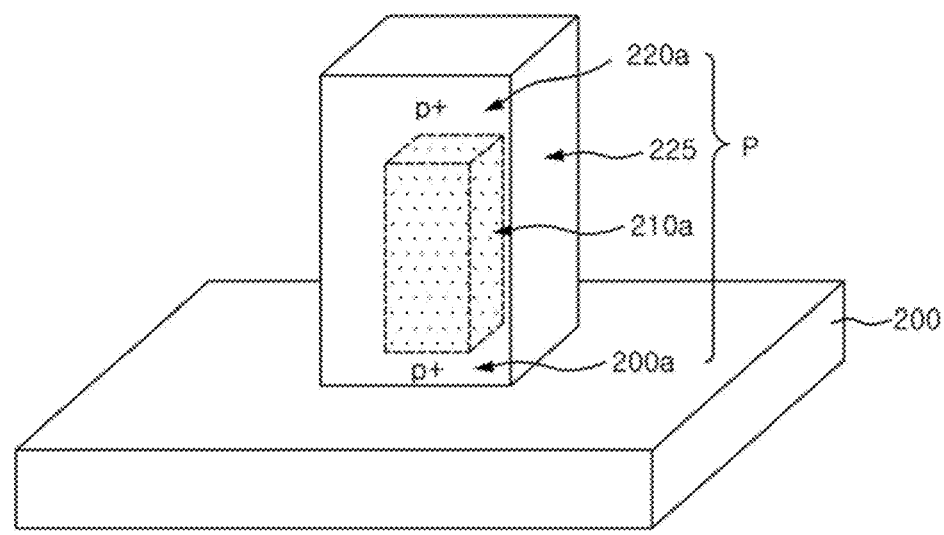
FIG. 7 is a perspective view illustrating a semiconductor device having a vertical channel according to an embodiment of the inventive concept.

As illustrated in FIG. 7, the PMOS transistor according to an embodiment may be formed so that the patterned first semiconductor layer 210a in which a channel is to be substantially formed may be formed of a material having a smaller lattice constant than the region other than the channel region, which includes, for example, the patterned portion of the semiconductor substrate 200a, the patterned second semiconductor layer 220a, and the third semiconductor layer 225. Therefore, differences of the lattice constants may be generated in junction interfaces between the semiconductor substrate 200 and the patterned first semiconductor layer 210a and between the patterned first semiconductor layer 210a and the patterned second semiconductor layer 220a, and thus compressive stress may be applied to the patterned first semiconductor layer 210a. When the compressive stress is applied to the patterned first semiconductor layer 210a in which the channel is to be formed, hole mobility of the PMOS transistor in which holes are major mobility may be considerably increased, and thus current drivability of the PMOS transistor may be improved.

Further, an outer circumference of the patterned first semiconductor layer 210a is surrounded with the third semiconductor layer 225 having a lattice constant different from the patterned first semiconductor layer 210a, in order to further apply additional compressive stress to the patterned first semiconductor layer 210a through a lateral junction between the patterned first semiconductor layers 210a and the third semiconductor layers 225.

Figure 8:
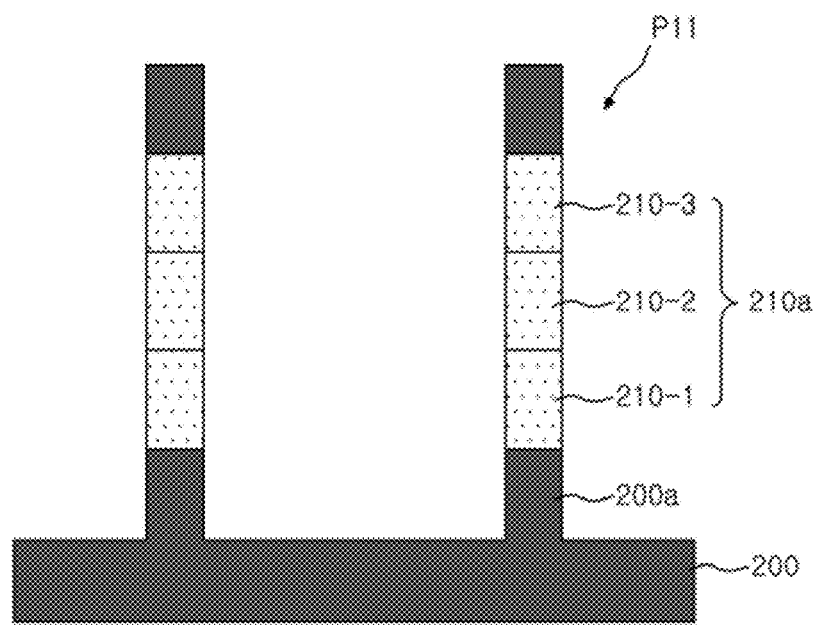
FIGS. 8 to 10 are cross-sectional views illustrating a method of manufacturing a semiconductor device having a vertical channel according to another embodiment of the inventive concept.

As illustrated in FIG. 8, a patterned first semiconductor layer 210a of a preliminary pillar 111 may be formed of a stacking layer including a first sub semiconductor layer 210-1, a second sub semiconductor layer 210-2, and a third sub semiconductor layer 210-3. When the patterned first semiconductor layer 210a is formed of SiC, the first sub semiconductor layer 210-1 and the third sub semiconductor layer 210-3 may be a SiC layer (hereinafter, referred to as a C-low concentration-SIC layer) in which a content of carbon (C) below a stoichiometric ratio of C in SIC is contained, and the second sub semiconductor layer 210-2 may be a SIC layer (hereinafter, referred to as a C-high concentration-SiC layer) in which a content of C above the stoichiometric ratio of C in SIC is contained. When the content of C in the SiC layer is increased, the lattice constant of the SIC layer tends to decrease. Therefore, a material having the smallest lattice constant is formed in a substantial effective channel zone of the patterned first semiconductor layer 210a to reduce electron mobility in the channel and to maximize hole mobility in the channel.

Figure 9:
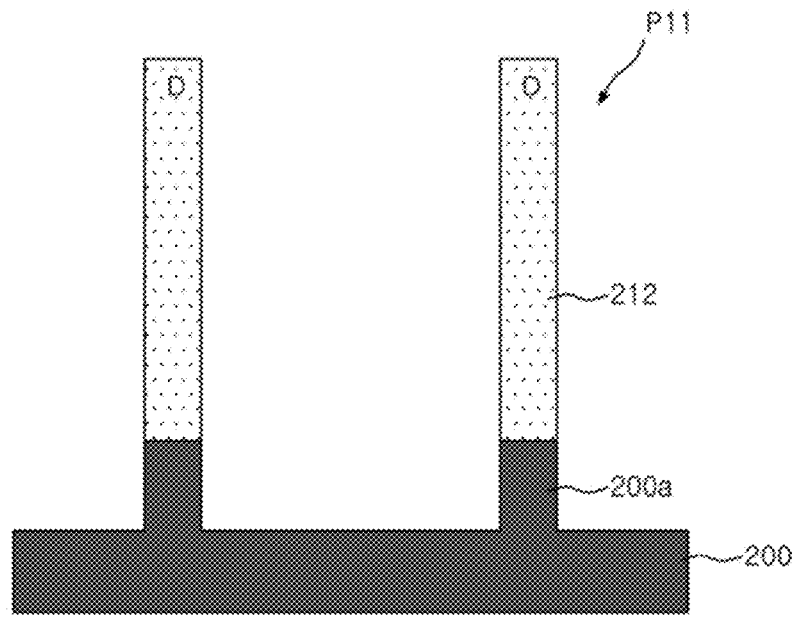

As illustrated in FIG. 9, a patterned first semiconductor layer 212 further extends by a length of a drain to form a preliminary pillar P11 without the patterned second semiconductor layer 220a of FIG. 2. Therefore, a drain D may be formed in an upper portion of the patterned first semiconductor layer 212.

Figure 10:
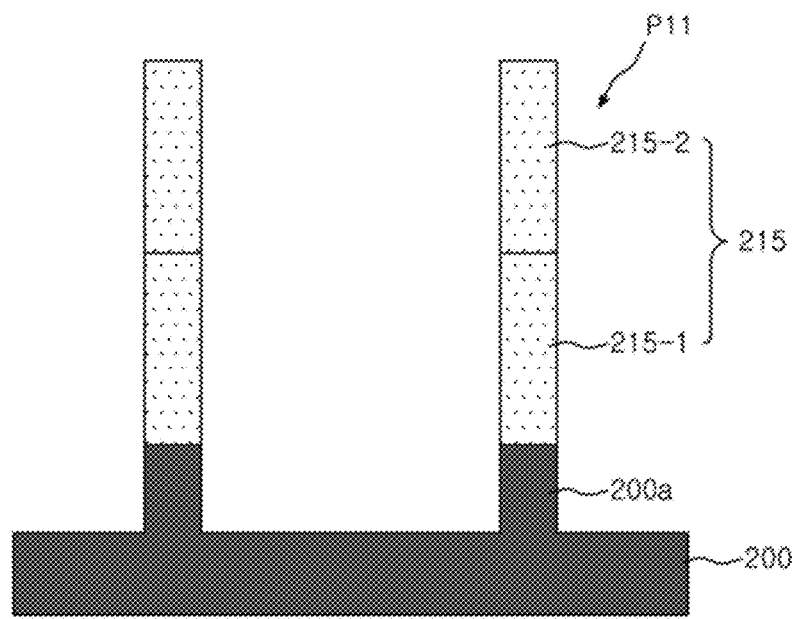

As illustrated in FIG. 10, a patterned first semiconductor layer 215 extends by a length of a drain to form a preliminary pillar P11 without the patterned second semiconductor layer 220a of FIG. 2 as described in FIG. 9. The patterned first semiconductor layer 215 may be formed of a C-low concentration-SIC layer 215-1 and a C-high concentration-SiC layer 215-2. The configuration of the patterned first semiconductor layer 215 may reduce a lattice constant of a channel to a direction of a drain D to increase a drain current of the PMOS transistor.

According to the embodiments, in a pillar structure having an inner portion and an outer portion formed to surround the inner portion, the inner portion is formed of a material having a smaller lattice constant than that of the outer portion. Therefore, compressive stress is applied to the inner portion of the pillar, in which a channel is to be substantially formed, thereby improving current drivability of the PMOS transistor.

The above embodiment of the present invention is illustrative and not limitative. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A semiconductor device, comprising:
a pillar extending substantially perpendicular from a semiconductor substrate, the pillar including an inner portion extending along a longitude direction of the pillar and an outer portion surrounding entire surface of the inner portion, wherein the outer portion includes an upper outer region positioned over the inner portion, a sidewall region positioned beside the inner portion, and a lower outer region positioned below the inner portion;
a drain formed in the upper outer region of the outer portion;
a source formed in the lower outer region of the outer portion;
a channel region formed in the inner portion;
a gate surrounding the pillar to form a cylinder shape;
a gate insulating layer formed between the gate and the pillar;
a heating electrode formed over the drain; and
a variable resistance layer formed on the heating electrode,
wherein the inner portion includes a semiconductor layer having a lattice constant that is smaller than a lattice constant of the outer portion so that the inner portion is subjected to a compress stress based on a junction with the outer portion.

2. The semiconductor device of claim 1, wherein the inner portion of the pillar is formed of a first semiconductor layer, and the outer portion of the pillar is formed of a second semiconductor layer and a third semiconductor layer,
wherein the first semiconductor layer has a first lattice constant, the second semiconductor layer has a second lattice constant being larger than the first lattice constant, and the third semiconductor layer has a third lattice constant being lager than the second lattice constant.

3. The semiconductor device of claim 2, wherein the upper outer region and the lower outer region of the outer portion are formed of the second semiconductor layer and the sidewall region of the outer region is formed of the third semiconductor layer.

4. The semiconductor device of claim 2, wherein the channel region is formed in the first semiconductor layer, and the drain is formed in the second semiconductor layer.

5. The semiconductor device of claim 2, wherein at least one of the semiconductor substrate, the second semiconductor layer, and the third semiconductor layer, constituting the outer portion of the pillar, includes a silicon (Si) material.

6. The semiconductor device of claim 5, wherein the first semiconductor layer includes one selected from the group consisting of SiC, AlN, GaN, ZnS, ZnO, ZnSe, CdS, BP, InN, and CdSe.

7. The semiconductor device of claim 6, wherein, when the first semiconductor layer is a SiC layer, the first semiconductor layer is formed of a C-low concentration-SiC layer that contains a content of C below a stoichiometric content of C in SiC, a C-high concentration-SiC layer that contains a content of C above the stoichiometric content of C in SiC, and a C-low concentration-SiC layer that contains a content of C below the stoichiometric content of C in SiC, which are sequentially stacked.

8. The semiconductor device of claim 1, wherein the channel region is formed of a material having a lattice constant smaller than that of at least one of the regions in which the source and drain are formed.

* * * * *